(12) United States Patent
Han

(10) Patent No.: US 6,861,866 B2
(45) Date of Patent: Mar. 1, 2005

(54) SYSTEM ON CHIP (SOC) AND METHOD OF TESTING AND/OR DEBUGGING THE SYSTEM ON CHIP

(75) Inventor: Dong-Kwan Han, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 81 days.

(21) Appl. No.: 10/358,282

(22) Filed: Feb. 5, 2003

(65) Prior Publication Data

US 2004/0017219 A1 Jan. 29, 2004

(30) Foreign Application Priority Data

Jul. 23, 2002 (KR) .................. 10-2002-0043354

(51) Int. Cl.[7] .............................. H03K 19/00
(52) U.S. Cl. ..................... 326/16; 714/727
(58) Field of Search ............... 326/16, 38; 327/202; 714/726, 727, 729, 731, 744

(56) References Cited

U.S. PATENT DOCUMENTS

| | | | |
|---|---|---|---|
| 5,396,498 A | 3/1995 | Lestrat et al. | |
| 5,510,704 A | 4/1996 | Parker et al. | |
| 5,774,475 A * | 6/1998 | Qureshi | ............ 714/726 |
| 5,831,446 A | 11/1998 | So et al. | |
| 6,044,481 A | 3/2000 | Kornachuk et al. | |
| 6,173,428 B1 | 1/2001 | West | |
| 6,430,718 B1 * | 8/2002 | Nayak | ............ 714/727 |

* cited by examiner

*Primary Examiner*—Brian Young
*Assistant Examiner*—Joseph Lauture
(74) *Attorney, Agent, or Firm*—Harness, Dickey & Pierce, P.L.C.

(57) ABSTRACT

A system on chip and method of testing and/or debugging the same, where the system on chip includes a plurality of circuits and a control circuit for receiving a serial-parallel mode control signal and at least one selection signal externally input from one or more of a plurality of pins and outputting an output signal depending on values of the serial-parallel mode control signal and the at least one selection signal.

21 Claims, 5 Drawing Sheets

SYSTEM ON CHIP (SOC) AND METHOD OF TESTING AND/OR DEBUGGING THE SYSTEM ON CHIP

This U.S. nonprovisional application claims priority under 35 U.S.C. § 119 of Korean Patent Application No. 2002-43354, filed Jul. 23, 2002, entitled "System on a Chip and Test/Debug Method Thereof," the entire contents of which are hereby incorporated by reference.

BACKGROUND OF THE INVENTION

1. Field of the Invention

The present invention relates to a system on chip (SOC), and more particularly to a SOC with cores and a method of testing and debugging the same.

2. Description of Related Art

Generally, the SOC includes a plurality of cores in a single chip. The cores embedded in the SOC are separately designed and tested before being combined in a chip. However, even if each core is normally operated when it is tested separately, when the cores are combined in a chip, they may not operate properly.

A plurality of cores embedded in a single chip may be tested in accordance with the IEEE standard 1149.1. According to IEEE standard 1149.1, three or four test input pins and one test output pin (TDO) may be used for testing and debugging the cores in the SOC. The three or four test input pins include a test data input pin (TDI), a test clock signal input pin (TCK), a test mode signal input pin (TMS) and a test reset signal input pin (which is optional). The test output pin (TDO) is used for outputting test data. The test clock signal input pin (TCK) and test mode signal (TMS) are input to a tap controller and the test data input (TDI) is input to an instruction register. The test output pin (TDO) is output by an output multiplexer.

The cores are placed in a test mode upon application of a test mode signal applied through the test mode signal input pin (TMS). The cores are reset by a reset signal applied through the test reset signal input pin and output the test data in response to a test clock signal input from the test clock signal input pin (TCK). The test data are input and output through the test data input pin (TDI) and test data output pin (TDO), respectively.

It may be desirable for an SOC having a plurality of cores to be tested and debugged in accordance with the IEEE standard 1149.1. However, the IEEE standard 1149.1 only provides a method of testing each core embedded in the SOC separately.

FIG. 1 is a block diagram of an SOC with cores according to IEEE standard 1149. 1 in accordance with one example of the conventional art. The conventional SOC 100 includes a chip level circuit 10, a first core 20 and a second core 30.

The chip level circuit 10 includes boundary scan registers 12-1 and 12-2, a test access port (TAP) controller 14 and a chip level logic circuit 16. The first core 20 includes boundary scan registers 22-1 and 22-2, a TAP controller 24 and a first logic circuit 26. The second core 30 includes boundary scan registers 32-1 and 32-2, a TAP controller 34 and a second logic circuit 36.

The SOC 100 includes test pins TDI, TMS, TRST, TCK and TDO for testing and debugging the chip level circuit 10, TDIA, TMSA, TRSTA, TCKA and TDOA for the first core 20, and TDIB, TMSB, TRSTB, TCKB and TDOB for the second core 30.

As shown in FIG. 1, all of the test pins are provided for every core 20, 30 and the chip level circuit 10. Accordingly, the number of the test pins of the SOC 100 increases as the number of the cores or chip level circuits embedded in the chip increases.

FIG. 2 is a block diagram showing a SOC 200 with cores according to IEEE standard 1149.1 in accordance with another example of the conventional art. The SOC 200 shown in FIG. 2 includes a chip level circuit 10, a first core 20, a second core 30 and a multiplexer 40. A detailed circuit configuration of the chip level circuit 10, the first core 20 and the second core 30 in FIG. 2 may be the same as in FIG. 1. The SOC 200 has a set of test pins TDI, TMS, TRST, TCK and TDO commonly used for testing each circuit block such as the chip level circuit 10, the first core 20 and the second core 30 and two selection signal pins SEL1 and SEL2 for receiving selection signals for controlling the multiplexer 40.

When the selection signals "00" are applied to the SOC 200 through the selection pins SEL1 and SEL2, the chip level circuit 10 is tested and debugged using the set of test pins TDI, TMS, TRST, TCK and TDO. When the selection signals "01" are applied to the SOC 200 through the selection pins SEL1 and SEL2, the first core 20 is tested and debugged using the set of test pins TDI, TMS, TRST, TCK and TDO. When the selection signals "10" are applied to the SOC 200 through the selection pins SEL1 and SEL2, the second core 30 is tested and debugged using the set of test pins TDI, TMS, TRST, TCK and TDO.

The SOC 200 in FIG. 2 has an advantage of having reduced test pins in comparison with the SOC 100 in FIG. 1. However, relative operation, operational interaction, and operational interference between the cores 20, 30 and the chip level circuit 10 and a general operation of the SOC 200 are not tested in either conventional example.

SUMMARY OF THE INVENTION

In an exemplary embodiment, the present invention is directed to a system on chip (SOC) with a plurality of circuits, the SOC being capable of testing general and/or relative operations between the circuits, where a circuit may be a core or a chip level circuit.

In an exemplary embodiment, the present invention is directed to an SOC, the SOC being capable of testing the circuits with a reduced number of test pins.

In another exemplary embodiment, the plurality of cores are in accordance with IEEE standard 1149.1.

In an exemplary embodiment, the present invention provides an SOC which tests relative operation, operational interaction, or operational interference between one or more cores, between one or more chip level circuits or between one or more cores and one or more chip level circuits.

In an exemplary embodiment, the relative operation, operational interaction, or operational interference between one or more cores, between one or more chip level circuits or between one or more cores and one or more chip level circuits includes, but is not limited to faults created by crosstalk and transmission line reflection phenomenon, due to adjacent circuitry (especially at high frequency), faults that cause timing violations when cores interact (that may cause signal skew among cores receiving the same signal), and faults that cause excessive power consumption in the overall system on chip.

In another exemplary embodiment the present invention provides a method of testing and debugging a system on chip (SOC) with a reduced number of test pins and being capable of testing and debugging general operations of the system and/or relative operations between cores embedded in the SOC and formed in accordance with IEEE standard 1149.1.

An exemplary embodiment of the present invention provides a SOC, comprising a plurality of pins for receiving and sending signals external to said system on chip, a plurality of circuits, each with a plurality of terminals, and control means for receiving a serial-parallel mode control signal and at least one selection signal externally input from one or more of the plurality of pins and outputting an output signal depending on values of the serial-parallel mode control signal and the at least one selection signal.

In another exemplary embodiment, the control means may include a shift register for shifting data input in serial through the test mode signal input pin in response to the test clock signal and outputting the data in parallel and a latch circuit for latching an output signal of the shift register in response to the test reset signal and outputting the latched signals as the selection signals and the serial-parallel test mode control signal.

In another exemplary embodiment, the number of the selection signals is $\log_2 n$ when the number of the cores and the chip level circuit is n.

In accordance with further another exemplary embodiment the present invention provideds a method of testing and/or debugging a system on chip having a plurality of input pins and a plurality of circuits, comprising receiving a serial-parallel mode control signal and at least one selection signal externally input from one or more of said plurality of pins and outputting an output signal depending on values of the serial-parallel mode control signal and the at least one selection signal.

In another exemplary embodiment, the number of the selection signals is $\log_2 n$ when the number of the cores and the at least one chip level circuit is n.

BRIEF DESCRIPTION OF THE DRAWINGS

These and other features and advantages of the present invention will be readily apparent to those of ordinary skill in the art upon review of the exemplary embodiments that follow when taken in conjunction with the accompanying drawings, in which like reference numerals denote like parts, and in which.

DETAILED DESCRIPTION OF EXEMPLARY EMBODIMENTS

Reference will now be made to exemplary embodiments of the present invention, which are illustrated in the accompanying drawings.

Figure 3:
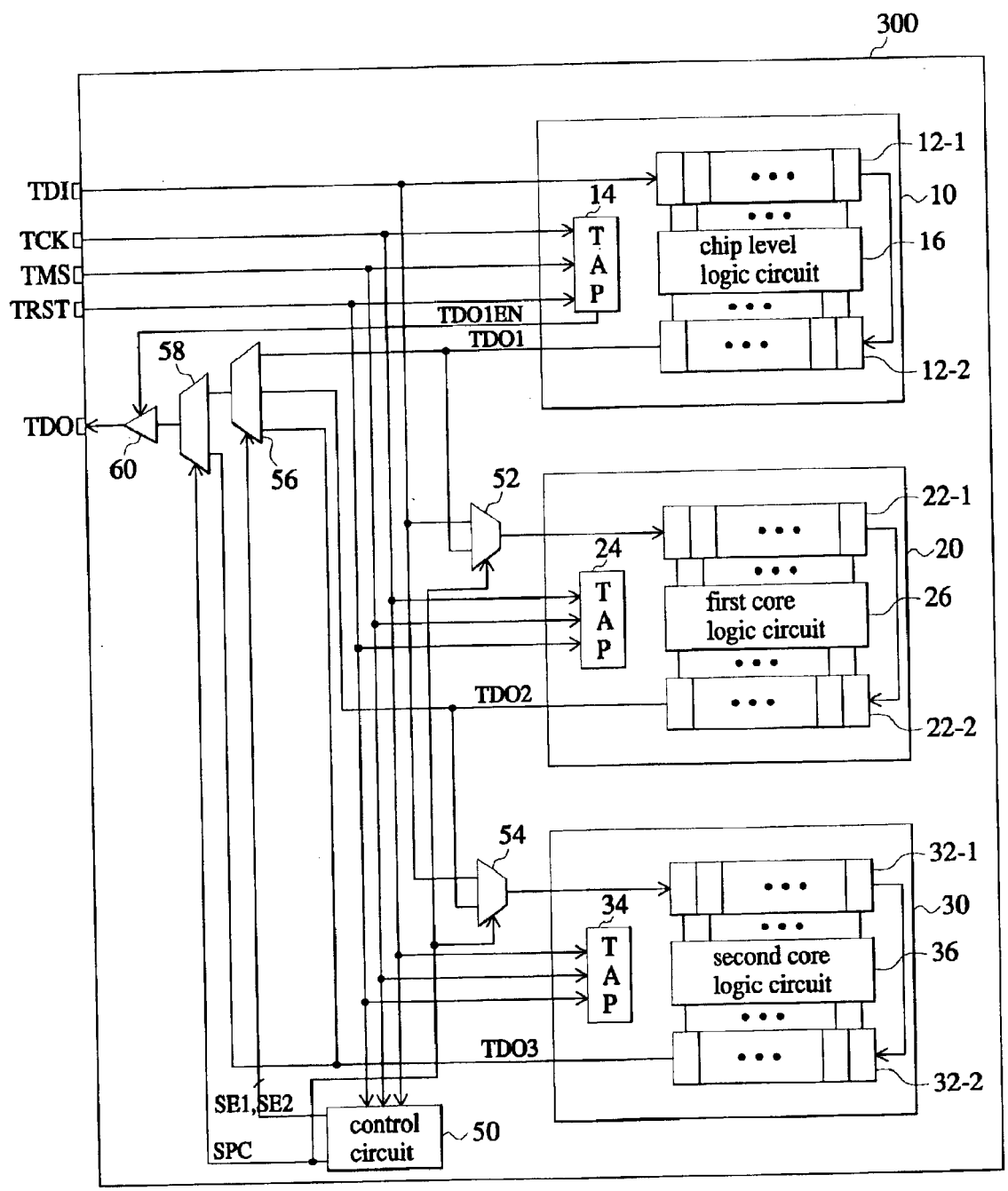
FIG. 3 is a block diagram of a single chip system with cores in accordance with an exemplary embodiment of the present invention.

FIG. 3 is a block diagram of a system on chip (SOC) 300 embedding a plurality of cores in accordance with an exemplary embodiment of the present invention. The SOC 300 comprises a chip level circuit 10, a first core 20, a second core 30, a control circuit 50, multiplexers 52, 54, 56 and 58 and a three-state buffer 60.

Figure 1:
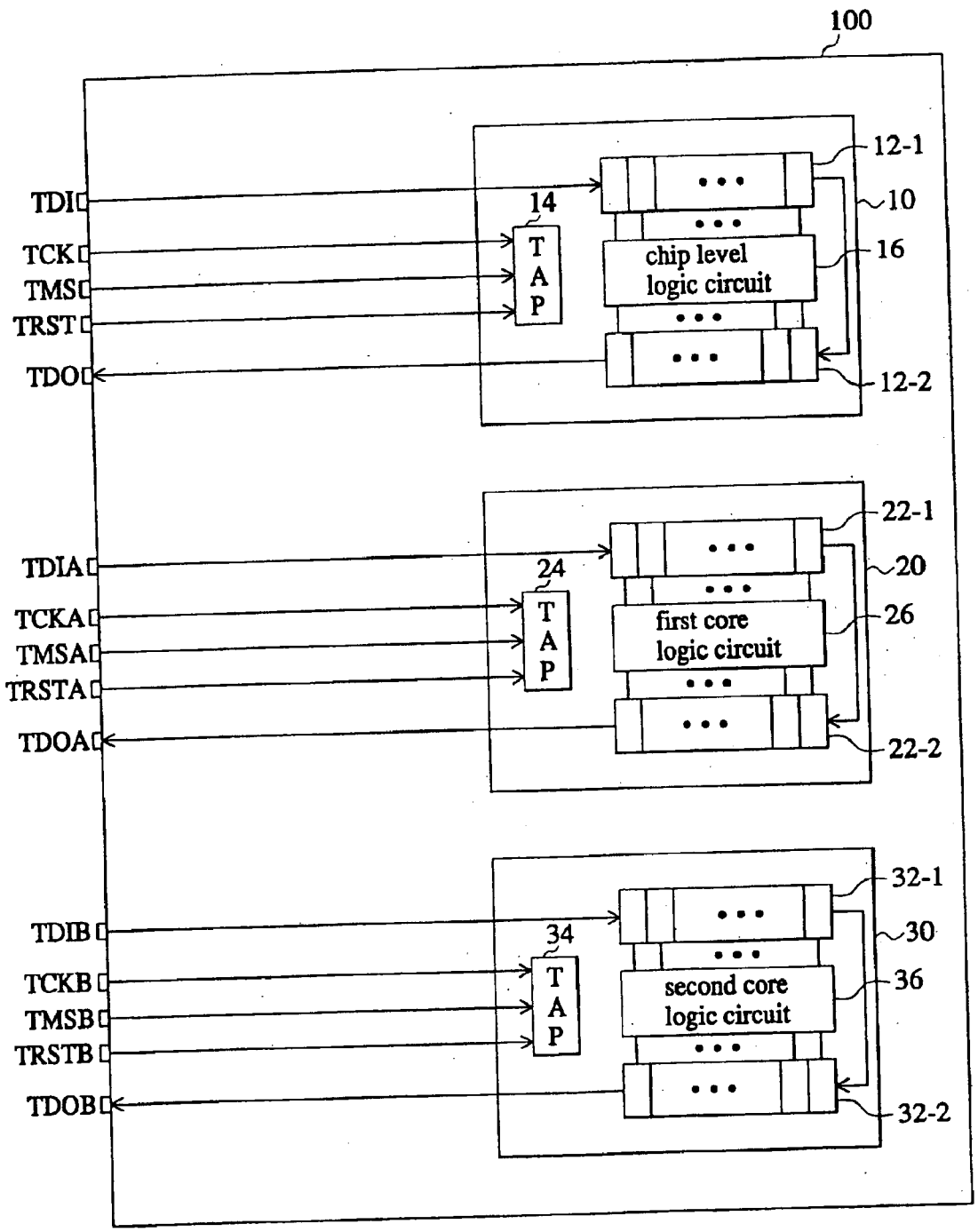
FIG. 1 illustrates a block diagram of a single chip system with cores according to the IEEE 1149.1 standard in accordance with an example of the conventional art.

In an exemplary embodiment, the detailed circuit configuration of the chip level circuit 10, the first core 20 and the second core 30 in FIG. 3 may be the same as that in FIG. 1.

Figure 2:
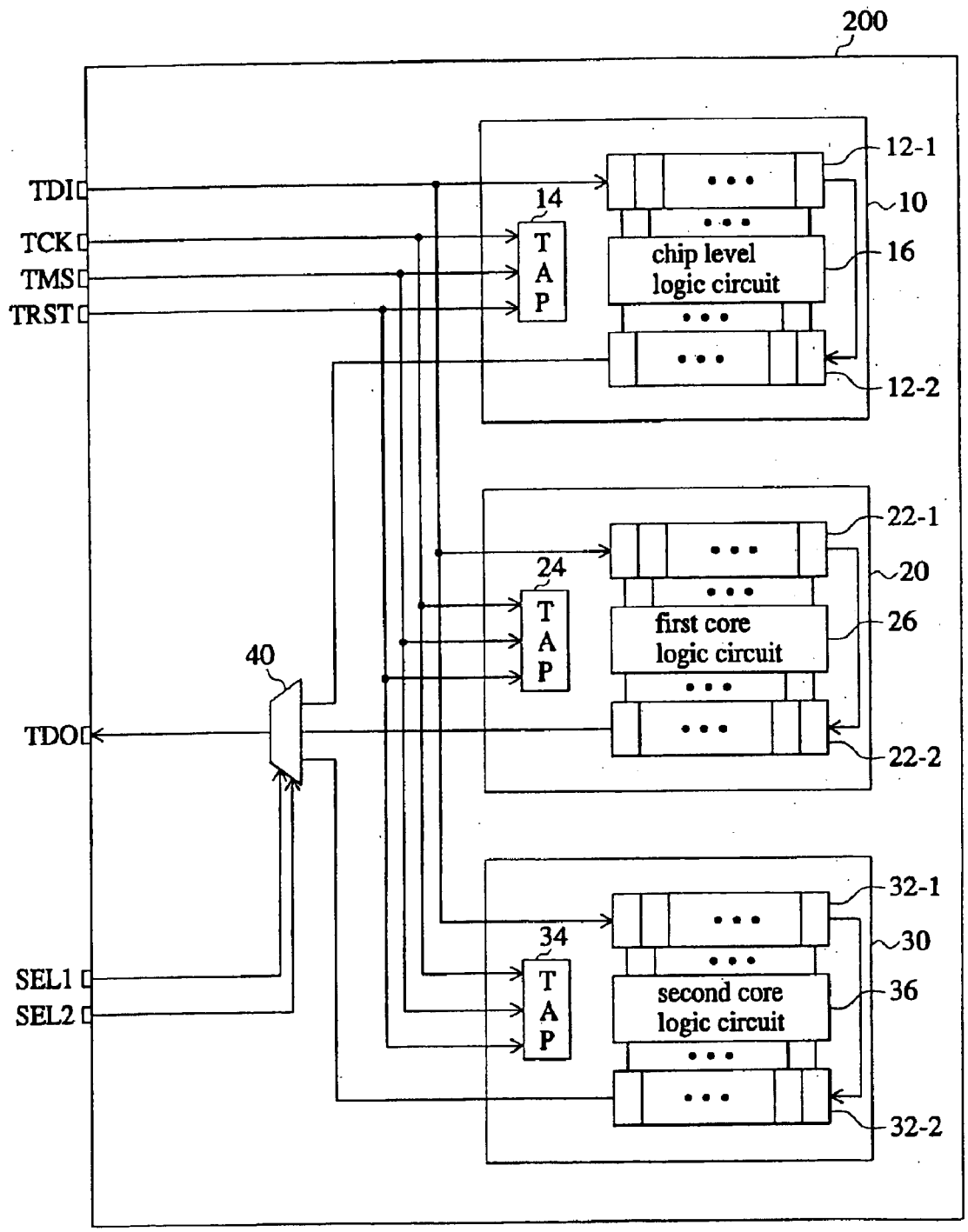
FIG. 2 illustrates a block diagram of a single chip system with cores according to the IEEE1149.1 standard in accordance with another example of the conventional art.

The SOC 300 may include a set of test pins TDI, TMS, TRST, TCK and TDO. The SOC 300 may have the reduced number of test pins as shown in FIG. 2 or the duplicative pins shown in FIG. 1.

The testing operations for the SOC 300 will be described below, in an exemplary embodiment.

The control circuit 50 receives data input from the test mode signal input pin TMS in response to a clock signal input from the test clock signal input pin TCK, stores the data and generates selection signals SEL1 and SEL2 and a serial-parallel control signal SPC using the stored data in response to a test reset signal input from the test reset signal input pin TRST.

The multiplexers 52 and 54 selectively output test output data TDO1, TDO2 in response to the serial-parallel control signal SPC in a serial test mode, and output test input data received from the test data input pin TDI in response to the serial-parallel control signal SPC in a parallel test mode.

The multiplexer 56 outputs the test output data TDO1, TDO2 and TDO3 in response to the selection signals SEL1 and SEL2.

The multiplexer 58 selectively outputs the test output data TDO3 in response to the serial-parallel control signal SPC in a serial test mode, while outputs an output signal of the multiplexer 56 in a parallel test mode.

The three-state buffer 60 buffers and outputs an output signal of the multiplexer 58 via the test data output pin TDO in response to a test data output enable signal TDO1 EN output from a test access port (TAP) control circuit 14 during testing.

For testing the chip level circuit 10, the test input data (TDI) may be input from a test data input terminal and stored in one or more boundary scan registers 12-1 and 12-2 under control of the TAP control circuit 14 and then forwarded to the chip level logic circuit 16. The chip level logic circuit 16 processes the test data received from the boundary scan registers 12-1 and 12-2 and outputs the test output data as the result of the processing. The test output data output from the chip level logic circuit 16 is input to the boundary scan registers 12-1 and 12-2. The boundary scan registers 12-1 and 12-2 output the test output data received from the chip level logic circuit 16 out of the SOC via a test data output terminal.

The first core 20 and the second core 30 may be tested in the same way as the chip level circuit 10.

Although the above operation describes testing the chip level circuit 10 and the various cores 20, 30, other diagnostic operations, such as debugging, could also be performed in a similar manner.

Figure 4:
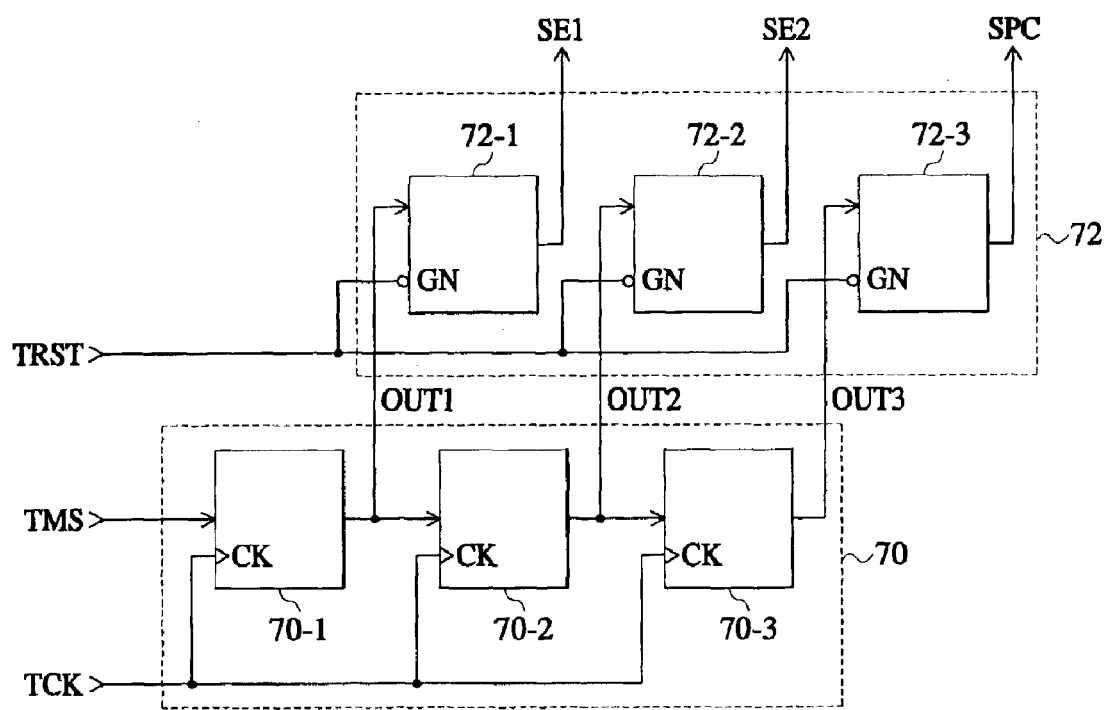
FIG. 4 is an exemplary circuit diagram of a control circuit shown in FIG. 3.

FIG. 4 is a circuit diagram of an exemplary implementation of the control circuit 50 shown in FIG. 3, where the control circuit 50 includes a shift register 70 and a latch circuit 72.

The shift register 70 may include flip-flops 70-1, 70-2 and 70-n and the latch circuit 72 may include n latch elements 72-1, 72-2 and 72-n.

The operation of the circuit shown in FIG. 4 is described below, in another exemplary embodiment.

Figure 5:
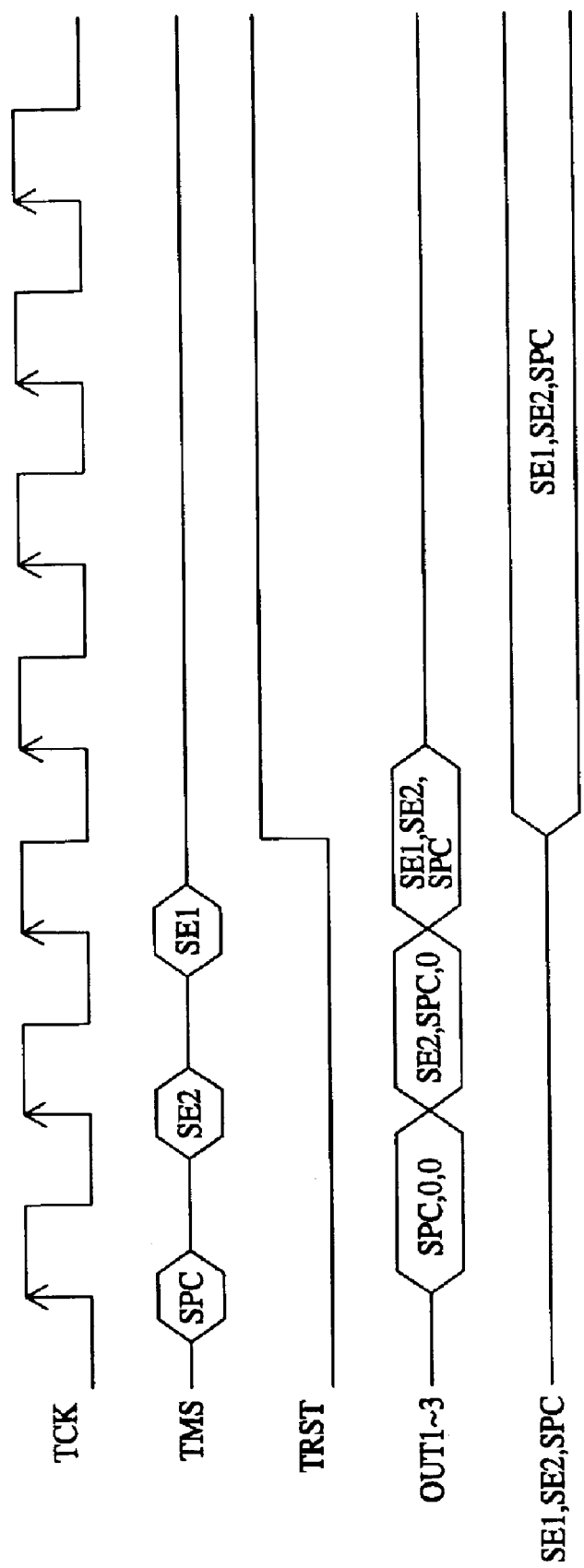
FIG. 5 is an exemplary timing diagram showing operation of the control circuit shown in FIG. 4.

As shown in FIG. 5, at a rising edge of the test clock signal (TCK), the shift register 70 shifts data input from the test mode signal input pin (TMS) in response to the test clock signal input from the test clock signal input pin (TCK).

The latch circuit 72 latches the data output from the shift register 70 in response to the test reset signal input from the test reset signal input pin TRST and generates selection signals SE1 and SE2, and a serial-parallel control signal SPC based on the data. That is, the latch circuit 72 maintains the logic level of the data as latched in the latch circuit 72 when the test reset signal has logic "high" level while latches data output from the shift register 70 when the test reset signal has a logic "low" level.

Although FIG. 4 illustrates the selection signals SE1 and SE2 and the serial-parallel mode control signal SPC as being input from the test mode signal input pin, they may also be input from the test data input pin.

The exemplary SOC 300 in FIG. 3 includes a chip level circuit 10 and two cores 20, 30. As a result, the control circuit 50 in FIG. 4 for testing and debugging the SOC 300 having a chip level circuit and two cores is comprised of three flip-flops 70-1, 70-2 and 70-3 and three latches 72-1, 72-2 and 72-3.

More generally, when a SOC 300 has a total of "n" chip level circuits and cores, $\log_2 n+1$ flip-flops and $\log_2 n+1$ latches are required for testing and debugging the SOC 300. For example, if n equals 3 or 4, then three flip-flops and three latches are required in the control circuit 50. If n equals 5 to 8, four flip-flops and four latches are required.

Further, the number of the selection signals SE1, SE2, . . . , SEn is $\log_2 n$ when the number of the circuits is n.

Table 1 shows logic levels of the selection signals SE1, SE2 and the serial-parallel control signal SPC for testing the chip level circuit 10 and the cores 20, 30 in the exemplary SOC 300.

TABLE 1

| Selection Signals | | Serial-Parallel Control Signal | Selected Circuit | Serial-Parallel |
| --- | --- | --- | --- | --- |
| SE1 | SE2 | SPC | To Be Tested | Test Mode |
| 0 | 0 | 0 | Chip Level Circuit | Parallel Test |
| 0 | 1 | 0 | First Core | Parallel Test |
| 1 | 0 | 0 | Second Core | Parallel Test |
| 1 | 1 | 0 | Chip Level Circuit | Parallel Test |
| X | X | 1 | All | Serial Test |

In Table 1, X denotes "don't care" state. When the selection signals SE1, SE2 and the serial-parallel control signal SPC have logic level "000" respectively, the test mode is the parallel test mode, thereby performing testing and/or debugging of the chip level circuit 10 in parallel. Thus, the multiplexer 56 outputs the test output data TDO1 received from the chip level circuit 10, and the multiplexer 58 outputs the data received from the multiplexer 56. The three-state buffer 60 buffers the data output from the multiplexer 58 and sends the buffered data to the test data output pin TDO. When the selection signals SE1, SE2 and the serial-parallel control signal SPC have logic level "110" respectively, the result is the same as above.

For the combination "010" of selection signals SE1, SE2 and the serial-parallel control signal SPC, the parallel test mode is performed, so that the test output data TDO2 output from the first core 20 is output through the test data output pin TDO via the multiplexers 56, 58 and the buffer 60.

Similarly, for the combination "100" of selection signals SE1, SE2 and the serial-parallel control signal SPC, the parallel test mode is performed, so that the test output data TDO3 output from the second core 30 is output through the test data output pin TDO via the multiplexers 56, 58 and the buffer 60.

When the serial-parallel control signal SPC has logic "1" level, the serial test mode is performed regardless of the logic levels of the selection signals SE1 and SE2. Thus, the test output data TDO1 output from the chip level circuit 10 is input to the first core 20 via the multiplexer 52, and then the test output data TDO2 output from the first core 20 is forwarded to the second core 30 via the multiplexer 54. Then, the test output data TDO3 output from the second core 30 is output from the test data output pin TDO via the multiplexers 56, 58 and the buffer 60.

As described above, testing and debugging an SOC with cores may be performed with a reduced number of the test pins in comparison with the conventional art of FIG. 1. Further, the testing and debugging for each single core or chip level circuit may be performed in a parallel test mode, and the general operation of the system and/or relative operations between the cores and the chip level circuit in the SOC may be performed in the serial test mode.

FIG. 5 illustrates a timing diagram for explaining operation of the control circuit 50 of FIG. 4.

First, the test reset signal with a logic "low" level is applied to the SOC 300 (shown in FIG. 3) through the test reset signal input pin TRST.

Next, at logic "low" level of the test clock signal input through the test clock signal input pin TCK, the serial-parallel control signal SPC and the selection signals SE1, SE2 are applied through the test mode signal input pin to the SOC 300.

Next, the shift register 70 shifts the serial-parallel control signal SPC and selection signals SE2, SE1 and outputs them at a rising edge of the test clock signal. That is, the shift register 70 outputs the serial-parallel control signal, a logic "0" level signal and a logic "0" level signal as output signals OUT1, OUT2 and OUT3, respectively, at the rising edge of a first clock of the test clock signal. The shift register 70 outputs the selection signal SE2, the serial-parallel control signal and a logic "0" level signal as the output signals OUT1, OUT2 and OUT3, respectively, at a rising edge of a second clock of the test clock signal. The shift register 70 outputs the selection signal SE1, the selection signal SE2 and the serial-parallel control signal as the output signals OUT1, OUT2 and OUT3, respectively, at a rising edge of a third clock of the test clock signal.

Next, the test rest signal with a logic "high" level is applied through the test reset signal input pin TRST. The latch circuit 72 outputs the output signals OUT1, OUT2 and OUT3 of the shift register 70 as the selection signal SE1, the selection signal SE2 and the serial-parallel control signal SPC.

The control circuit 50 of FIG. 4 sets the state of the selection signals SE1, SE2 and the serial-parallel control signal SPC as described above.

The method of testing and debugging the SOC described above relates to a SOC having a chip level circuit and two cores but the system and method may be applied to an SOC having any number of chip level circuits and/or cores.

In an exemplary embodiment, any or all of the cores described above are cores in accordance with IEEE standard 1149.1.

Although the various embodiments of the present invention have been described in conjunction with the control circuit 50, multiplexers 52, 54, 56 and 58 and the three-state buffer 60, any equivalent circuit could also be utilized as would be apparent to one of ordinary skill in the art.

Although the various embodiments of the present invention have been described in conjunction with the set of test pins TDI, TMS, TRST, TCK and TDO, any equivalent set of pins could also be utilized as would be apparent to one of ordinary skill in the art.

The various embodiments of the present invention may be used in conjunction with a conventional SOC with a redundant number of pins, a conventional SOC with a reduced number of pins, or any other SOC known to one of ordinary skill in the art.

Although the various embodiments of the present invention have been described in conjunction with triggering the output of the output signal of the multiplexer 58 via the test data output pin in response to a test data output enable signal output from a TAP control circuit, this output could be triggered by another signal from another source as would be apparent to one of ordinary skill in the art.

As used in the appended claims, the term "circuit" is used to identify a core or a chip level circuit as described above, or any other circuit that could be tested, debugged or otherwise evaluated, as would be apparent to one of ordinary skill in the art.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. A system on chip, comprising:
   a plurality of pins including a test clock signal input pin, a test data input pin, a test mode signal input pin, a test reset signal input pin and a test data output pin;
   a plurality of circuits, each with a test clock signal input terminal, a test data input terminal, a test mode signal input terminal and a test data output terminal;
   a controller for receiving a serial-parallel mode control signal and selection signals externally input in response to a test clock signal and outputting the input signals in response to a test reset signal input;
   a first selector for outputting test output data upon receiving an output from one of the test data output terminals of the plurality of circuits through the test data output pin; and
   a second selector for outputting the output of the first selector as test output data when the serial-parallel mode control signal indicates a parallel test mode, and for generating the test output data serially processed by the plurality of circuits by using the test input data input from the test data input pin.

2. The system on chip according to claim 1, wherein the second selector includes:
   a first selection circuit for receiving test input data input through the test data input pin, inputting the test input data to every test data input terminals in the plurality of circuits when the serial-parallel control signal indicates the parallel test mode, and inputting data output from a test data output terminal of a respective previous circuit of the plurality of circuits to a test data input terminal of a respective next circuit when the serial-parallel control signal indicates the serial test mode;
   a second selection circuit for outputting the data output from the first selection circuit in the parallel test mode and outputting the data output from a last circuit of the plurality of circuits which is located at an electrically last location in the serial test mode.

3. The system on chip according to claim 1, wherein the data output from the second selection circuit is transmitted to the test data output pin in response to a test data output enable signal output through the plurality of circuits.

4. The system on chip according to claim 1, wherein the controller includes:
   a shift register for shifting data input in serial through the test mode signal input pin in response to the test clock signal and outputting the data in parallel; and
   a latch circuit for latching an output signal of the shift register in response to the test reset signal and outputting the latched data as the selection signals and the serial-parallel test mode control signal.

5. The system on chip according to claim 1, wherein the controller includes:
   a shift register for shifting data input in serial from the test data input pin in response to the test clock signal and outputting the data in parallel;
   a latch circuit for latching an output signal of the shift register in response to the test reset signal and outputting the latched data as the selection signals and the serial-parallel mode control signal.

6. The system on chip according to claim 1, wherein the number of the selection signals is $\log_2 n$ when the number of the circuits is n.

7. The system on chip of claim 1, wherein said plurality of circuits includes a combination of one or more cores or one or more chip level circuits.

8. The system on chip of claim 7, wherein said one or more cores are in accordance with IEEE standard 1149.1.

9. A system on chip, comprising:
   a plurality of pins including a test clock signal input pin, a test data input pin, a test mode signal input pin, a test reset signal input pin and a test data output pin;
   a plurality of circuits, each with a test clock signal input terminal, a test data input terminal, a test mode signal input terminal and a test data output terminal;
   a contoller for receiving a number of selection signals and a serial-parallel mode control signal that are externally input in response to a test clock signal, and outputting the inputted signals in response to a test reset signal input;
   a first selector for outputting test output data output from one of the test data output terminals of the plurality of circuits in response to the selection signals through the test data output pin;
   a second selector for outputting data output from the first selector, or outputting data output from the test data output terminal of a circuit out of the plurality of circuits, the circuit being electrically at the last location in response to the serial-parallel mode control signal; and
   a third selector for receiving test input data input from the test data input pin and inputting the received test input data to the test data input terminals of the plurality of circuits in response to the serial-parallel mode control signal.

10. The system on chip according to claim 9, wherein an output signal of the second selector is output through the test data output pin in response to a test data output enable signal output from the plurality of circuits.

11. The system on chip according to claim 9, wherein the controller includes:
  a shift register for shifting data input in serial from the test mode signal input pin in response to the test clock signal and outputting the data in parallel; and
  a latch circuit for latching an output signal of the shift register in response to the test reset signal and outputting the selection signals and the serial-parallel mode control signal using the latched signal.

12. The system on chip according to claim 9, wherein the controller includes:
  a shift register for shifting data input in serial from the test data input pin in response to the test clock signal and outputting the data in parallel; and
  a latch circuit for latching an output signal of the shift register in response to the test reset signal and outputting the selection signals and the serial-parallel mode control signal in response to the latched data.

13. The system on chip according to claim 9, wherein the number of the selection signals is $\log_2 n$ when the number of the circuits is n.

14. The system on chip of claim 9, wherein said plurality of circuits includes a combination of one or more cores or one or more chip level circuits.

15. The system on chip of claim 14, wherein said one or more cores are in accordance with IEEE standard 1149.1.

16. A method of testing/debugging a system on chip having a plurality of input pins including a test clock signal input pin, a test data input pin, a test mode signal input pin, a test reset signal input pin and a test data output pin, and a plurality of circuits, each with a test clock signal input terminal, a test data input terminal, a test mode signal input terminal and a test data output terminal, comprising:
  inputting a number of selection signals and a serial-parallel mode control signal in response to a test clock signal input from the test clock signal input pin and outputting the selection signals and the serial-parallel mode control signal in response to a test reset signal input from the test reset signal input pin;
  inputting test input data input from the test data input pin to every test data input terminal in the plurality of circuits when the serial-parallel mode control signal indicates a parallel test mode;
  inputting the test input data input from the test data input pin to the test data input terminal of the plurality of circuits at an electrically first location of the plurality of circuits, and inputting the test output data output from a previous circuit to a next circuit successively until the test output data is input to a last circuit when the serial-parallel control signal indicates a serial test mode;
  outputting the test output data output from one of the test data output terminals in the plurality of circuits through the test data output pin in response to the selection signals when the serial-parallel control signal indicates the parallel mode; and
  outputting the test output data output from the last of the plurality of circuits through the test data output pin when the serial-parallel mode control signal indicates the parallel mode.

17. The method of testing/debugging the system on chip according to claim 16, wherein the number of the selection signals is $\log_2 n$ when the number of the plurality of circuits is n.

18. The method of claim 16, wherein the plurality of circuits includes a combination of one or more cores or one or more chip level circuits.

19. The method of claim 18, wherein the one or more cores are in accordance with IEEE standard 1149.1.

20. A system on chip, comprising:
  a plurality of pins for receiving and sending signals external to said system on chip;
  a plurality of circuits, each with a plurality of terminals; and
  a controller for receiving a serial-parallel mode control signal and at least one selection signal externally input from one or more of said plurality of pins and outputting an output signal depending on values of the serial-parallel mode control signal and the at least one selection signal.

21. A method of testing and/or debugging a system on chip having a plurality of input pins and a plurality of circuits, comprising:
  receiving a serial-parallel mode control signal and at least one selection signal externally input from one or more of said plurality of pins; and
  outputting an output signal depending on values of the serial-parallel mode control signal and the at least one selection signal.

* * * * *